United States Patent [19]

Coleman et al.

[11] 4,144,094

[45] Mar. 13, 1979

[54] RADIATION RESPONSIVE CURRENT GENERATING CELL AND METHOD OF FORMING SAME

[75] Inventors: Michael G. Coleman, Tempe; Lawrence A. Grenon; Robert A. Pryor, both of Phoenix; Fabio Restrepo, Scottsdale, all of Ariz.

[73] Assignee: Motorola, Inc., Schaumburg, Ill.

[21] Appl. No.: 745,937

[22] Filed: Nov. 29, 1976

Related U.S. Application Data

[63] Continuation of Ser. No. 538,973, Jan. 6, 1975, abandoned.

[51] Int. Cl.² ............................................... H01l 31/06
[52] U.S. Cl. .................... 136/89 CC; 29/572; 136/89 SJ; 357/30; 357/52
[58] Field of Search ............... 136/89 CC, 89 SJ; 357/30, 52, 23; 29/572

[56] References Cited

U.S. PATENT DOCUMENTS

| | | | |
|---|---|---|---|
| 3,442,721 | 5/1969 | McCaldin et al. | 148/33 |
| 3,620,829 | 11/1971 | Beck | 136/89 CC X |
| 3,769,558 | 10/1973 | Lindmayer | 136/89 SJ X |
| 3,928,073 | 12/1975 | Besson et al. | 136/89 |

OTHER PUBLICATIONS

B. E. Deal "The Current Understanding of Charges in the Themally Oxidized Silicon Structure," J. Electrochem. Soc. vol. 121, pp. 198c–205c.

A.J. Diefenderfer, "Principles of Electronic Instrumentation" W. B. Saunders Co., Phila. Pa. (1972), pp. 144–145.

K. V. Vaidyanathan et al. "The Effect of Be+Ion Implanted Exponetial & Uniform Impurity Profiles on the Electrical Characteristics of GaAs Solar Cells," Conf. Record, 10th IEEE Photo-Specialists Conf. Nov. 1973, pp. 31–33.

*Primary Examiner*—John H. Mack
*Assistant Examiner*—Aaron Weisstuch
*Attorney, Agent, or Firm*—John A. Fisher

[57] ABSTRACT

A semiconductor cell for generating current in response to incident radiation, particularly solar energy, wherein a layer of material having charges is disposed over the PN current generating junction. The layer having charges possesses a net bound charge of the same polarity as the minority carriers associated with the underlying semiconductor material for aiding minority carrier flow across the PN junction and for minimizing recombination of those minority carriers at the surface of the semiconductor body.

15 Claims, 4 Drawing Figures

RADIATION RESPONSIVE CURRENT GENERATING CELL AND METHOD OF FORMING SAME

This is a continuation of application Ser. No. 538,973, filed Jan. 6, 1975, now abandoned.

BACKGROUND OF THE INVENTION

1. Field of Invention

This invention relates to current generating cells, and more particularly to a current generating cell responsive to radiation, such as solar energy.

2. Description of the prior art.

A conventional silicon radiation responsive cell, having a characteristic response curve for energy, FIGS. 1 and 2, includes a body 10 having a first semiconductor P type conductivity region 12 and an overlying N+ conductivity semiconductor region 14 for forming a PN junction 16. For prior art structures, such as those used in space exploration, the cell 10 includes a starting substrate of silicon material approximately 10 mils thick. Thereafter an N+ diffusion into the starting semiconductor substrate results in the first P type region 12 and the overlying N+ region 14 approximately 0.5 microns thick. The back of the body 10 is coated with a metalized layer 17 and a plurality of upper surface metal contacts designated generally at 18 provide electrical contact to the PN junction 16. The upper surface contacts 18 are separated and formed of minimal dimensions in order to allow a maximum amount of incident radiation to be absorbed by the upper N+ region 14.

The prior art and preferred embodiments are illustrated for silicon material and solar radiation, however, it is to be understood that other radiation sources, such as infrared, and other materials can be used for forming the PN junction, for example, germanium, gallium phosphide, gallium arsenide, cadmium sulfide, etc. It is known that the bandgap for silicon is approximately 1.1 electron volts. Only radiation with energy greater than this energy will create electron hole pairs. As a result, only incident radiation of wavelength less than about 1.2 microns possesses sufficient energy to traverse this bandgap.

In FIG. 1 the incident radiation is illustrated by schematic rays 20 impinging upon the upper N+ region 14. The photons associated with the incident radiation 20 are effective to create electron hole pairs generally depicted at 22 and 24. The shorter wave lengths of incident radiation primarily form electron hole pairs in the upper region 14 and are not effective to create electron hole pairs deeper into the body 10. The longer wave lengths, that is in the region of 1.2 microns, are effective to not only create electron hole pairs in the upper region 14 but deeper into the P type region 12. Once the electron hole pairs are formed, the minority carriers in each of the regions 12 and 14 attempt to diffuse across the PN junction 16 for generating output current.

The longer the minority carrier lifetime the more assurance that the minority carriers are able to cross the PN junction 16 and contribute to the generation of output current. Ideally, all of the electron hole pairs generated in the upper N+ region 14 will diffuse across the PN junction 16. However due to surface imperfections some of the minority carriers associated with the upper N+ region 14 diffuse upwardly as opposed to across the PN junction and thus recombine at the upper surface 32 of region 14. Consequently, the efficiency of the cell is diminished. Solar cells of the prior art and also of the present invention can be formed by numerous processes such as ion implantation, diffusion, or epitaxial processes. Similarly, heterojunction devices formed, for example, with germanium and gallium arsenide, gallium arsenide and gallium aluminum arsenide, etc. also can be employed to form the PN junction.

In the case of diffused junctions, the high impurity concentration level at the surface of the device, by its very nature, tends to produce a field gradient which will assist the minority carriers in the upper N+ region in diffusing across the PN junction rather than diffusing in the opposite direction and recombining at the upper surface 32. However, this inherent advantage of device profiling tends to decrease the lifetime of the minority carriers in that region and thus offsets the advantages of producing a field gradient by impurity profiling of the device itself.

In addition to profiling it is well known in other semiconductor areas, such as, MOS, that an applied potential forms an electric field in order to vary the conductivity of the channel existing between source and drain. In the typical structures, the applied potential generates a charge which is of the same polarity as the channel material in order to change its conductivity type and thus provide a top upper surface conductive channel between the source and drain.

Literature and prior art also mentions the fact that the existence of an oxide layer often causes a problem in that positive charges inherent in some $SiO_2$ layers tend to invert P type material thus causing undesirable shorting or leakage paths between other N type regions located on the substrate.

Accordingly, improving the efficiency of a solar radiation cell by profiling so to introduce a field gradient is limited in practice because the profiling approach shortens the minority carrier lifetime and offsets some of the advantages gained by the built-in field gradient. As previously discussed, an electric field is either intentionally or intrinsically created for converting a semiconductor region of one conductivity type to an opposive conductivity type material.

SUMMARY OF THE INVENTION

It is therefore an object of the present invention to provide an improved or more efficient radiation responsive current generating cell, particularly solar, wherein the amount and efficiency of minority carrier flow across the cell PN junction is increased.

Another object of the present invention is to provide an improved radiation responsive current generating cell in which undesirable minority carrier recombination at the surface of the cell is reduced.

A further object of the present invention is to provide an improved radiation responsive current generating cell by employing a known disadvantage or phenomenon of the prior art, i.e., surface inversion and MOS technology, respectively, in an opposite manner in order to improve current generating efficiency.

In accordance with the aforementioned objects, the present invention provides a layer of material having charges disposed over the thin layer of semiconductor material used to form one side of the current generating PN junction. The layer of material having charges possess a charge of the same polarity as the minority carriers associated with the thin layer of semiconductor material for aiding minority carrier flow across the PN junction and for minimizing surface recombination of minority carriers.

DESCRIPTION OF THE PREFERRED EMBODIMENTS

Figure 1:
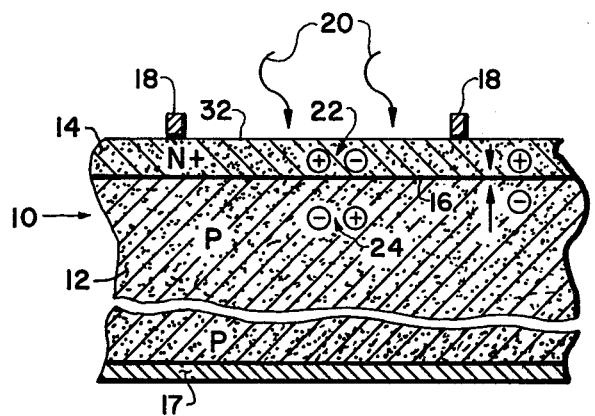
FIG. 1 illustrates a prior art radiation responsive current generating cell.
Figure 2:
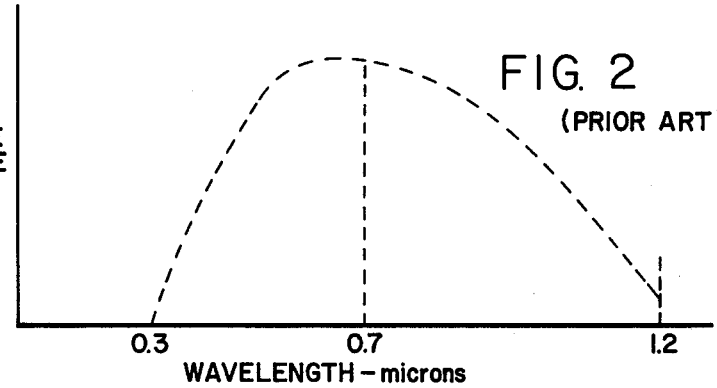
FIG. 2 illustrates its absorption characteristic curve.
Figure 3:
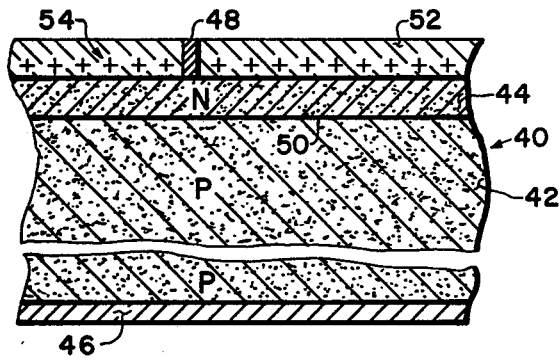
FIGS. 3 and 4 show partially broken away, cross-sectional views of the preferred cell embodiments of the present invention.
Figure 4:
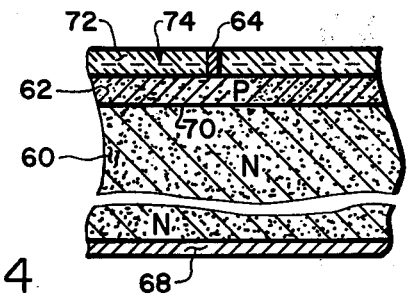

Now referring to FIG. 3, it illustrates a silicon solar radiation responsive cell 40 comprising a first P conductivity type region 42 and an overlying N conductivity type region 44. A back side metallized layer 46 and upper surface metal contacts 48 to the N region 44 (only one shown) complete electrical connections to a PN junction 50 formed by regions 42 and 44, respectively. A third region or layer of material 52 having charges is disposed over the thin upper region 44. In this embodiment, the layer 52 possesses dopants having charges of the same polarity as the minority carriers associated with region 44. In the case of an N type conductivity upper layer 44, the charges in layer 52 are positive as indicated generally at 54. As illustrated in FIG. 4, the present invention is equally applicable to the use of a lower N type region 60 and an overlying P region 62 having metallized contacts 64 and 68 for receiving generated current from a PN junction 70. In this embodiment, the overlying charged layer is constituted by a layer 72 having a net negative charge as indicated generally at 74.

Operationally, solar radiation passing through the upper layer 52 and into the regions 42 and 44 creates electron hole pairs. Due to the positive charge contained in layer 52, minority carriers in layer 44 will be aided in traveling downwardly across the PN junction 50 so as to recombine in region 42 in order to generate usable output current. Conversely, the positive charges in layer 52 opposes the movement of minority carriers upwardly and thus assists in preventing surface recombination of the minority carriers existing in layer 44. A similar operation results with the embodiment of FIG. 4 except in this instance the layer material having charges includes negative charges indicated in 74 in order to assist minority carrier flow associated with layer 62 across junction 70 into region 60.

The layer 52 or 64 can be constituted by a layer of appropriate antireflective optical thickness which is substantially transparent to the incident radiation and made of a material which is intrinsically or impurity doped to contain the desired charges. Examples of intrinsically doped materials are P or N type zinc sulfides, P or N type tin oxides, etc. Impurity doped materials can be constituted by oxides, nitrides or oxynitrides of silicon containing impurity ions. Negative or positive ions can be created with the introduction of chlorine and sodium, respectively. It is expected that other suitable doping materials can be selected from common chemicals and the periodic table. Additionally, other suitable compounds, other than oxides or nitrides of silicon, can be selectively doped, such as, oxides of titanium, tantalum, cerium, etc.

Appropriately doped layers also can be disposed over both upper and lower surfaces of the cell in order to increase current generation, even though the preferred embodiment only illustrates the charged layer over one surface.

What is claimed is:

1. A cell for generating current in response to incident radiation, comprising: a body including a first region of a first conductivity type, a second region of opposite conductivity type diffused into a portion of said first region for forming a PN junction; and a third region disposed over said second region and said third region being of a different material than said second region and comprising a material being substantially transparent to the incident radiation, and said third region comprising dopants for providing, absent the application of an external voltage potential to said third region, ions of the same polarity as the minority carriers associated with said second region for aiding minority carrier flow across said PN junction and for minimizing recombination of second region minority carriers at a second region surface.

2. A cell for generating current in response to incident radiation as in claim 1 further comprising:
   (a) contact means connected to said body for receiving the generated current in response to incident radiation passing through said third region.

3. A cell for generating current in response to incident radiation as in claim 2 wherein:
   (a) said first and second regions comprise silicon material.

4. A cell for generating current in response to incident radiation as in claim 1 wherein:
   (a) said first region comprises a P conductivity semiconductor material and said second region comprises an N conductivity semiconductor material, and
   (b) said third region of material includes positive ions.

5. A cell for generating current in response to incident radiation as in claim 1 wherein:
   (a) said third region of material comprises an oxide of silicon.

6. A cell for generating current in response to incident radiation as in claim 1 wherein:
   (a) said third region of material comprises a nitride or oxynitride of silicon.

7. A cell for generating current in response to incident radiation comprising: a body including a first region of a flat conductivity type, a second region of opposite conductivity type diffused into a portion of said first region for defining a PN junction; and a third region disposed over said second region and said third region being of a different material than said second region and comprising a material being substantially transparent to the incident radiation, and said third region comprising dopants for providing, absent the application of an external voltage potential to said third region, ions of the same polarity as the minority carriers associated with said second region for aiding minority carrier flow across said PN junction and for minimizing recombination of second region minority carriers at a second region surface,
   said first region comprises an N conductivity semiconductor material and said second region comprises a P conductivity semiconductor material, and
   said third region of material includes negative ions.

8. A cell for generating current in response to incident radiation, comprising: a body including a first region of a first conductivity type, a second region of opposite conductivity type for defining a PN junction;

and a third region disposed over said second region and said third region being of a different material than said second region and comprising a material being substantially transparent to the incident radiation, and said third region comprising dopants for providing, absent the application of an external voltage potential to said third region, ions of the same polarity as the minority carriers associated with said second region for aiding minority carrier flow across said PN junction and for minimizing recombination of second region minority carriers at a second region surface, said first region comprises a P conductivity semiconductor material and said second region comprises an N conductivity semiconductor material, and said third region of material includes positive ions, and said PN junction comprises a heterojunction.

9. A cell for generating current in response to incident radiation, comprising: a body including a first region of a first conductivity type, a second region of opposite conductivity type for defining a PN junction; and a third region disposed over said second region and said third region being of a different material than said second region and comprising a material being substantially transparent to the incident radiation, and said third region comprising dopants for providing, absent the application of an external voltage potential to said third region, ions of the same polarity as the minority carriers associated with said second region for aiding minority carrier flow across said PN junction and for minimizing recombination of second region minority carriers at a second region surface, said first region comprises an N conductivity semiconductor material and said second region comprises a P conductivity semiconductor material, and said third region of material includes positive ions, and said PN junction comprises a heterojunction.

10. A method for forming a cell for generating current in response to incident radiation, comprising: providing a body including a first region of a first conductivity type, diffusing a portion of said body to form a second region of opposite conductivity within said first region for forming a PN junction; and forming a third region over said second region of a different material than said second region and comprising a material being substantially transparent to the incident radiation; and introducing into said third region dopants for providing ions of the same polarity as the minority carriers associated with said second region for aiding minority carrier flow across said PN junction and for minimizing recombination of second region minority carriers at a second region surface.

11. A method for forming a cell for generating current in response to incident radiation as in claim 10 including the step of:

(a) forming said third region by depositing a layer of material containing charges over said second region.

12. A method for forming a cell for generating current in response to incident radiation as in claim 11 further comprising the step of:

(a) forming contact means to said body for receiving the generated current in response to incident radiation passing through said third region of material.

13. A method for forming a cell for generating current in response to incident radiation as in claim 11 including the steps of:

(a) forming said first region of a P conductivity semiconductor material and said second region of an N conductivity semiconductor material, and (b) forming said third region of material with positive ions.

14. A method for forming a cell for generating current in response to incident radiation, comprising: providing a body including a first region of a first conductivity type, a second region of opposite conductivity diffused into said first region for forming a PN junction; and forming a third region over said second region of a different material than said second region and comprising a material being substantially transparent to the incident radiation; introducing into said third region dopants for providing ions of the same polarity as the minority carriers associated with said second region for aiding minority carrier flow across said PN junction and for minimizing recombination of second region minority carriers at a second region surface; forming said third region by depositing a layer of material containing charges over said second region;

forming said first region of an N conductivity semiconductor material and said second region of a P conductivity semiconductor material; and forming said third region with negative ions.

15. A radiation responsive current generating cell, comprising: a substrate formed of a first material of a first type conductivity; a second material of a second type conductivity and being formed as an epitaxial layer on the substrate so that a PN junction is formed therebetween; a third material formed as a layer on the second material, the third material having dopants which causes an equilibrium electric field between the second and third materials which assists flow of minority carriers from the second material to the substrate when electron-hole pairs are generated by incident radiation upon the cell; at least one conductor extending through the third material and making contact with the second material; and a second conductor in contact with the substrate so that the at least one conductor and the second conductor serve as current carrying terminals for the cell.

* * * * *